US005529626A

United States Patent [19]

Stewart

[11] Patent Number: 5,529,626
[45] Date of Patent: Jun. 25, 1996

[54] SPINCUP WITH A WAFER BACKSIDE DEPOSITION REDUCTION APPARATUS

[75] Inventor: David R. Stewart, Sacramento, Calif.

[73] Assignee: NEC Electronics, Inc., Mountain View, Calif.

[21] Appl. No.: 327,730

[22] Filed: Oct. 24, 1994

[51] Int. Cl.⁶ .................................................. B05C 13/00
[52] U.S. Cl. ........................... 118/500; 118/50; 118/52; 118/56; 118/58; 118/66; 118/69; 118/319; 118/320; 118/501; 118/730
[58] Field of Search ................... 118/50, 52, 56, 118/58, 66, 69, 319, 320, 500, 501, 728, 730; 427/294; 269/21; 414/935, 936, 941

[56] References Cited

U.S. PATENT DOCUMENTS

| 4,518,078 | 5/1985 | Garrett | 414/935 |
|---|---|---|---|
| 4,685,852 | 8/1987 | Rubin et al. | 118/500 |
| 5,061,144 | 10/1991 | Akimoto et al. | 118/500 |
| 5,238,499 | 8/1993 | van de Ven et al. | 118/724 |
| 5,292,554 | 3/1994 | Sinha et al. | 118/728 |
| 5,315,749 | 5/1994 | Nenadic et al. | 269/21 |
| 5,403,397 | 4/1995 | Beckers et al. | 414/935 |

FOREIGN PATENT DOCUMENTS

| 0058365 | 5/1979 | Japan | 269/21 |
|---|---|---|---|
| 4080940 | 3/1992 | Japan | 414/936 |
| 4176533 | 6/1992 | Japan | 269/21 |

*Primary Examiner*—Laura Collins
*Attorney, Agent, or Firm*—Skjerven, Morrill, MacPherson, Franklin & Friel; Kent B. Chambers

[57] ABSTRACT

A spincup having a wafer backside deposition reduction apparatus is used to reduce wafer backside particle deposition of materials on a wafer during processing. The spincup includes an opening for accommodating a wafer supporting chuck and a particle guard which circumscribes the chuck. The particle guard contacts the base of the spincup and circumscribes the chuck. When the chuck supports a wafer, a wafer backside region is defined between the chuck and the particle guard. The spincup further includes an exhaust channel coupled to the wafer backside region to independently exhaust the wafer backside region. In one embodiment, the exhaust channel includes an exhaust port for connecting a vacuum generator to the exhaust channel and a shroud contacting a base of the spincup and the particle guard. In another embodiment, the exhaust channel includes exhaust tubes which replace the exhaust manifold shroud and exhaust port.

16 Claims, 7 Drawing Sheets

5,529,626

1

SPINCUP WITH A WAFER BACKSIDE DEPOSITION REDUCTION APPARATUS

BACKGROUND OF THE INVENTION

1. Field of the Invention

This invention relates to spincups used during integrated circuit fabrication.

2. Description of Related Art

Integrated circuit fabrication on a wafer, such as a silicon wafer, involves interconnecting individual electrical circuit features to create electrical circuits. The individual electrical circuit features are often characterized by dimensions ranging from several microns to sub-micron. To create the individual circuit features, lithographic processes are used to form patterns on the wafer. The patterns define the physical regions occupied by the individual circuit features. Lithographic processes involve applying photoresist materials to a wafer and selectively exposing the photoresist through a mask (or reticle in step and repeat projection systems). Lithographic processes further involve a development process for developing the photoresist by applying a solvent known as a developer to form patterns which define individual electrical circuit features. To fabricate many small, individual circuit features on a single wafer, the patterns defining the individual circuit features are extremely precise. The precision of the patterns can be adversely affected by contaminants on the wafer and by a non-planar wafer surface.

Wafer contamination, wafer deformation, and the introduction of factors that can cause such may occur during various phases of wafer processing. For example, when developing the photoresist in a spincup, particles from sources such as developer which fail to adhere to the frontside of the wafer undergoing processing and contaminants present in the spincup may disadvantageously deposit on the backside of the wafer. When the backside portion of the wafer, with backside deposits present, is placed on a surface, the wafer may deform due to the forces exerted by the backside deposited particles. Because of the small individual electrical circuit feature dimensions, even slight deformation can result in the distortion of patterns which define the feature dimensions. Pattern distortion may result in a malformed and/or misaligned individual circuit feature which may render one or more electrical circuits on the wafer useless. Additionally, particles deposited on the backside of the wafer are a source of potential contamination during wafer processing. Contaminants in the process environment have well known disadvantageous effects.

Utilization of a spincup in the development process is described in further detail with reference to FIGS. 1 and 2. FIG. 1 illustrates a top plan view of a spincup assembly having spincup 100 and chuck 118, and FIG. 2 illustrates a cross-sectional view of the spincup assembly in FIG. 1. The spincup 100 is used in conjunction with a developer machine (not shown). Referring to FIGS. 1 and 2, chuck 118 extends through base 104 and supports wafer 204 within spincup 100. An ambient region 210 is bounded by the frontside of wafer 204, spincup sidewalls 102, particle guard 106, the openings of drain holes 108a–108f, a portion of base 104 extending between particle guard 106 and spincup sidewalls 102, and a cover (not shown) over spincup 100. A portion of developer dispensing nozzle 202 is shown in FIG. 2 positioned above the frontside of wafer 204. A remaining portion of developer dispensing nozzle 202 (not shown) is attached to a developer reservoir (not shown) which includes a

2 developer such as an alkaline solution diluted with water or an organic solvent. During developer application to wafer 204, the developer dispensing nozzle 202 dispenses a spray of the developer under pressure in the direction of the frontside of wafer 204. In order to obtain approximately uniform developer deposition on the frontside of wafer 204, wafer 204 is spun at a rate of approximately 4000 rpm. Following the deposition of developer, chemical reactions involving developer in contact with exposed photoresist (unexposed photoresist in negative development processes) occur. Following the cessation of developer deposition, approximately one and a half minutes elapse before dispensing a rinse solution to allow for completion of the photoresist/developer reactions. The rinse solution, such as deionized water, is also dispensed through developer dispensing nozzle 202 to rinse wafer 204.

During developer dispensing onto wafer 204 many particles from various sources and for various reasons are present in the ambient region 210 during development processing. Some developer particles adhere to the frontside of wafer 204 while other developer particles are spun off the frontside of wafer 204 into the ambient region 210. Furthermore, some developer particles impact the wafer 204 frontside and deflect into the ambient region 210. Additionally, some particles such as contaminants present in the spincup 100 and photoresist/developer reaction products are present in the ambient region 210 during developer dispensing. Some of the particles which fail to adhere to the frontside of wafer 204 accumulate at the base 104 during developer dispensing and are drained through exhaust/drain opening 110 through exhaust/drain shaft 206 into a fluid reservoir (not shown). Some of the particles form a developer-photoresist reaction products-contaminant particle mist ("developer particle mist") in the ambient region 210 which substantially occupies the ambient region 210. A vacuum generator (not shown) connected to exhaust/drain shaft 206 creates a negative pressure differential between the ambient region 210 and the exhaust/drain opening 110 to progressively evacuate the developer particle mist from the ambient region 210.

During rinse solution dispensing onto wafer 204 many particles from various sources and for various reasons are present in the ambient region 210 during development processing. When dispensing rinse solution onto wafer 204, rinse solution and photoresist/developer reaction products are spun off the frontside of wafer 204 and into ambient region 210. Some of the rinse solution and photoresist/developer reaction products impact the wafer 204 frontside and deflect into the ambient region 210. Additionally, other particles such as contaminants are present in the ambient region 210 during rinse solution dispensing. Some of the particles accumulate at the base 104 during developer dispensing and are drained through exhaust/drain opening 110 through exhaust/drain shaft 206 into a fluid reservoir (not shown). Some of the particles form a rinse solution-photoresist/developer reaction products-contaminants particle mist ("rinse particle mist") in the ambient region 210 which substantially occupies the ambient region 210. A vacuum generator (not shown) connected to exhaust/drain shaft 206 creates a negative pressure differential between the ambient region 210 and the exhaust/drain opening 110 to progressively evacuate the solution particle mist from the ambient region 210.

Spincup 100 includes back rinse nozzles 111 and 112 which are connected to a rinse solution source (not shown). Back rinse nozzles 111 and 112 spray deionized water onto the backside periphery of wafer 502 in an attempt to prevent deposition thereon. However, some of the particles present in the ambient region 210, such as particles in the particle mist, nevertheless reach the backside of wafer 204 and enter wafer backside region 208. Drain holes 108a–108f extend through particle guard 106 into the ambient region 210 and are intended to drain any fluid present in wafer backside region 208.

Spincup 100 further includes back blow nozzles 116 (the back blow nozzles are collectively identified as 116) which are evenly spaced apart and open beneath wafer 204 between blocking wall 114 and chuck 118. Back blow nozzles 116 are connected to a gas source (not shown), such as a nitrogen gas reservoir, and blow a gas against the backside of wafer 204. The gas from back blow nozzles 116 attempts to prevent rinse particles from reaching a backside portion of wafer 204 immediately proximate to chuck 118 between blocking wall 114 and chuck 118.

Some of the particles in the particle mist not only enter wafer backside region 208, they disadvantageously deposit on the backside of wafer 204. The material deposition on the backside of wafer 204 disadvantageously affects the yield of functional electrical circuits on the wafer and increases integrated circuit costs.

SUMMARY OF THE INVENTION

It has been discovered that reducing turbulent flow in a wafer backside region by independently exhausting the wafer backside region and/or reducing the volume of the wafer backside region advantageously reduces the amount of wafer backside particle deposition and, therefore, contributes to increases in integrated circuit yields.

In one embodiment of the present invention, a spincup, for use with a chuck for supporting a wafer, includes a base having an opening for accommodating the chuck. The spincup further includes a wall circumscribing the base and enclosing an ambient region and a particle guard. The particle guard contacts the base of the spincup and circumscribes the opening. When the wafer and chuck are present, the particle guard, a backside of the wafer, and the chuck define a wafer backside region. The spincup further includes an exhaust channel coupled to the wafer backside region to independently exhaust the wafer backside region.

In another embodiment of the present invention, an exhaust manifold shroud is used in conjunction with a vacuum generator to exhaust the wafer backside region during processing. In another embodiment of the present invention, exhaust tubes are used in conjunction with a vacuum generator to exhaust the wafer backside region during processing.

BRIEF DESCRIPTION OF THE DRAWINGS

Reference numerals referring to the same feature appearing in multiple Figures are the same.

The features, aspects, and advantages of the present invention will become better understood with regard to the following description, appended claims, and accompanying drawings where:

DETAILED DESCRIPTION

The following description sets forth a detailed description of the best contemplated mode for carrying out the invention. The description is intended to be illustrative of the invention and should not be taken to be limiting.

Figure 3:
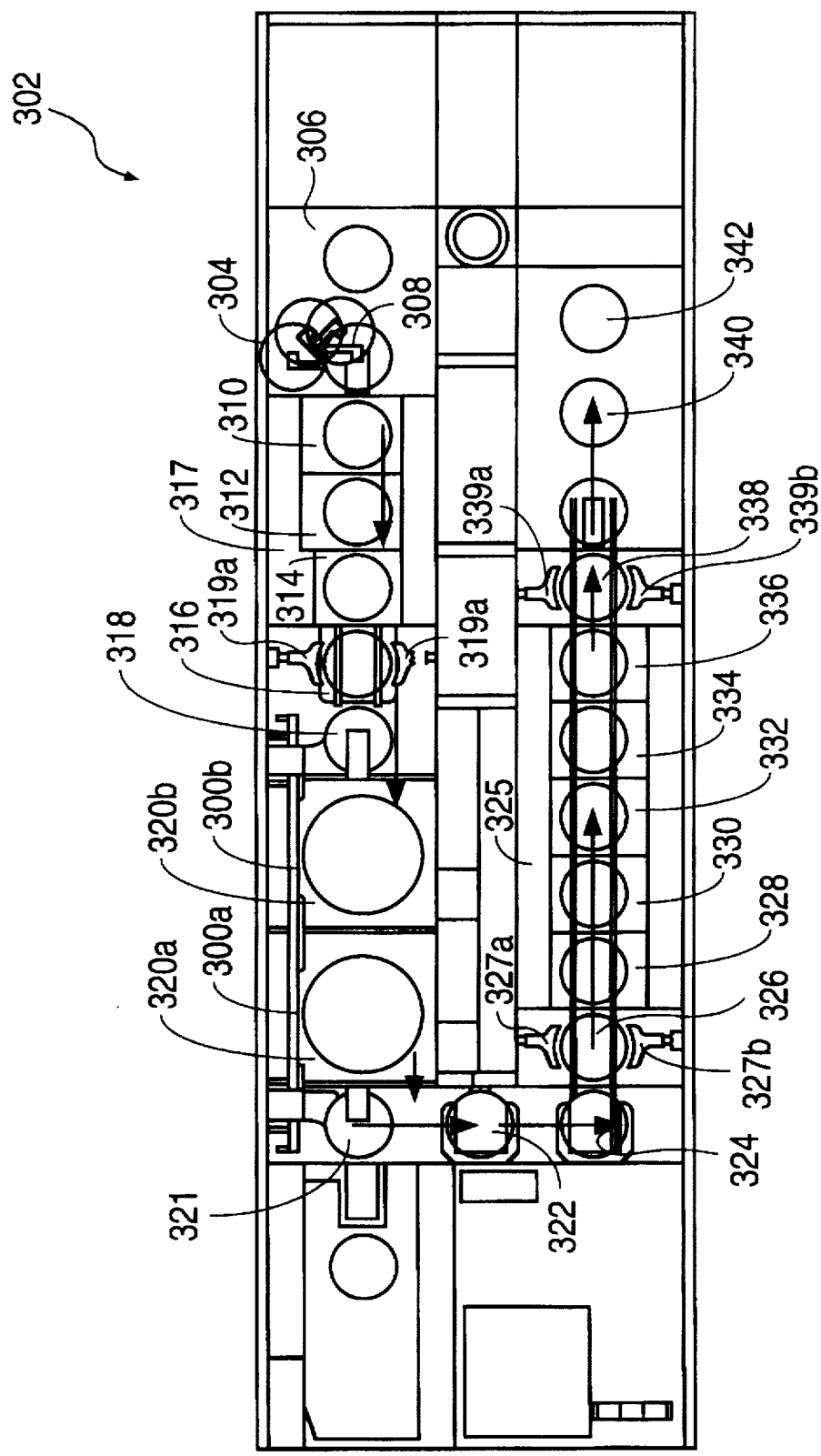
FIG. 3 illustrates a top plan view of a developer machine incorporating a spincup with an apparatus for reducing particle quantities under the backside of a wafer.

Various integrated circuit fabrication processes and integrated circuit fabrication systems employ spincups when applying materials to an object. For example, integrated circuit fabrication processes and systems employ spincups during the development process of applying developer to a wafer. Referring to FIG. 3, one illustrative use of spincups 300a and 300b involves a developer machine, which is, for example, a Yuasa Mega Line Developer, manufactured by Yuasa Manufacturing Company Limited of Tokyo, Japan. Such a system employs spincups 300a and 300b during an integrated circuit fabrication development process. Spincups 300a and 300b incorporate an apparatus for reducing particle deposition on the backside of a wafer during the integrated circuit fabrication development process in the developer machine 302. It is contemplated that spincups 300a and 300b may incorporate the same embodiment of a wafer backside deposition reduction apparatus or different embodiments. FIG. 3 also depicts, as indicated by the arrows, an illustrative step by step flow of a wafer through multiple process stations in the developer machine 302.

Referring to FIG. 3, wafer 304 is received by developer machine 302 from a stepper (not shown) at a sender interface 306. A linear arm 308, shown in four consecutive (top to bottom) positions, transports wafer 304 to a process station having a first post exposure bake hot plate 310 in the post exposure bake unit 317. Wafer 304 then proceeds to a process station having a second post exposure bake hot plate 312. The first and second post exposure bake hot plates 310 and 312, respectively, bake resist onto wafer 304 after being exposed in the stepper (not shown) and before development in spincup 300a or 300b. Next, wafer 304 proceeds to a process station having a first wafer cooling plate 314 and subsequently to a process station having a second wafer cooling plate 316. The first and second cooling plates 314 and 316, respectively, cool wafer 304 to room temperature before development in spincup 300a. Also, wafer centering arms 319a and 319b, center wafer 304 on the second wafer cooling plate 316 in preparation for entering a process station having spincup 300b.

A process station having a "cup in" unit 308 has a linear motion arm which takes wafer 304 from the second wafer cooling plate 316 and places it in the spincup 300b. Spincups 300a and 300b are located in spincup process stations 320a and 320b, respectively. Wafer 304 is then placed in spincup 300a for development; however, wafer 304 can be processed in spincup 300b. Because developer machine 302 employs two spincup stations 320a and 320b with spincups 300a and 300b, respectively, two wafers are generally simultaneously transported and processed in spincups 300a and 300b, respectively. Developer is applied to wafer 304 and the second wafer and rinsed within spincups 300a and 300b, respectively.

Following the application and rinsing of developer, a process station having a "cup out linear motion arm" unit 321 uses a linear motion arm to take wafer 304 from spincup 300a and places it on a turn linear motion arm 322. Turn linear motion arm 322 takes wafer 304 from cup out linear motion arm unit 321 and transports wafer 304 to turn linear motion arm unit 324. Turn linear motion arm unit 324 takes wafer 304 from turn linear motion arm unit 322 and transports wafer 304 to a process station having an oven centering plate 326 and wafer centering arms 327a and 327b. Wafer centering arms 327a and 327b center wafer 304 on wafer centering plate 326 before wafer 304 enters post development bake oven 325.

Post development bake oven 325 has successive process stations each having an oven hot plate 328–336, respectively. Wafer 304 is successively transported to each oven hot plate 328–336. Oven hot plates 328–336 bake wafer 304 after development. From oven hot plate 336, wafer 304 proceeds to a process station having receiver centering plate 338 which centers wafer 304 with wafer centering arms 339a and 339b. Next, wafer 304 is transported to receiver 340 or 342. The selection of receiver 340 or 342 depends on the available capacity of receivers 340 and 342. Receivers 340 and 342 have elevators which store multiple wafers in individual slots. A full description of the operation of the Yuasa Mega Line Developer may be found in the Yuasa "In-line Developer Operation Manual".

Figure 4:
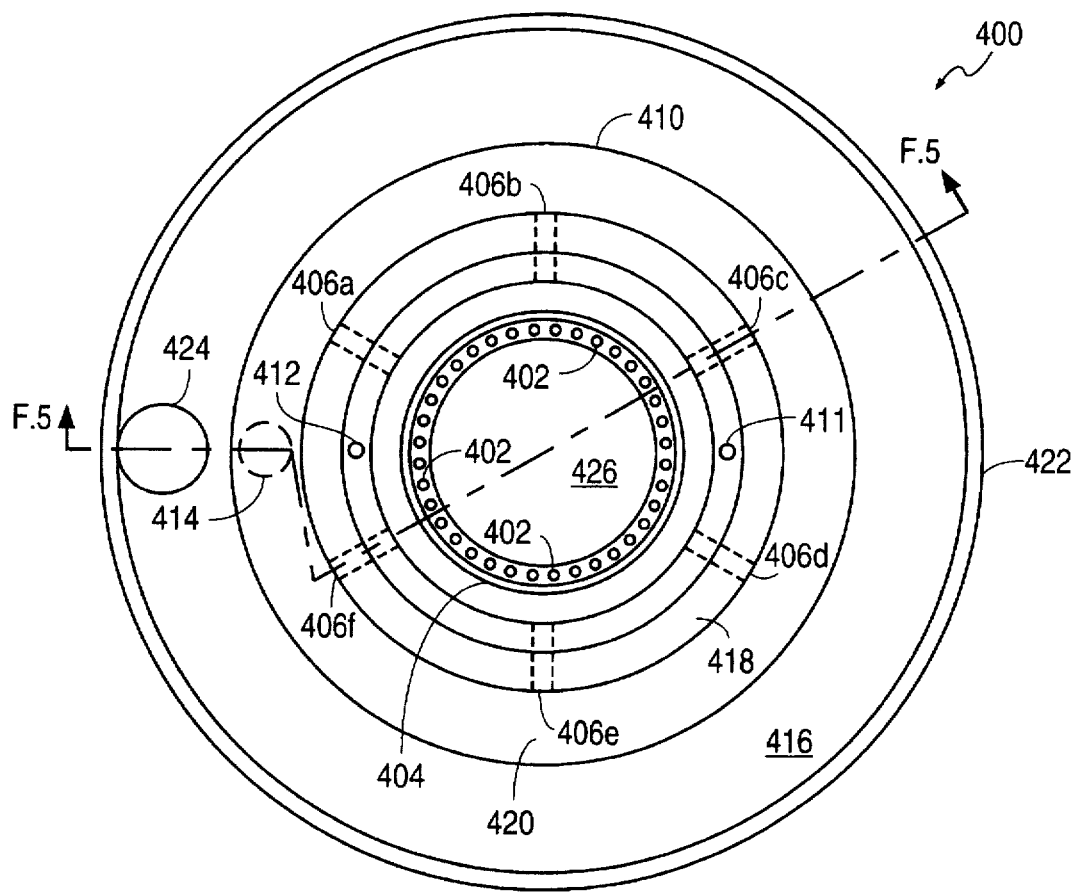
FIG. 4 illustrates a top plan view of a spincup assembly with an exhaust manifold shroud.
Figure 5:
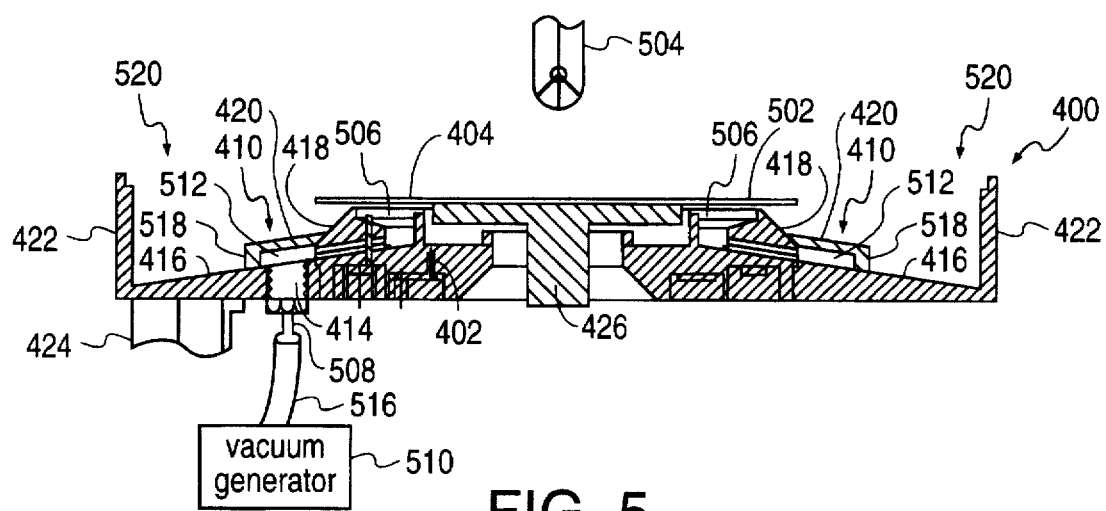
FIG. 5 illustrates a cross-sectional view of the spincup assembly with the exhaust manifold shroud of FIG. 4.

One embodiment of the spincups 300a and 300b is spincup 400 illustrated in FIGS. 4 and 5. FIGS. 4 and 5 are illustrative of one preferable embodiment of a spincup with a wafer backside deposition reduction apparatus which reduces the amount of particle deposition on the backside of a wafer during processing by facilitating the independent exhaustion of the wafer backside region 506. FIG. 4 illustrates a top view of a spincup assembly having spincup 400 and chuck 426, and FIG. 5 illustrates a cross-sectional view of the spincup assembly of FIG. 4. Spincup 400 includes a spincup base 416, a spincup wall 422, a particle guard 418, and an exhaust channel. Exhaust port 414, shrouded region 512, and drain holes 406a–406f form one embodiment of the exhaust channel. FIG. 4 further illustrates spincup 400 having an exhaust manifold shroud 410. The drain holes 406a–406f have a diameter of 5 mm, respectively. FIG. 5 further illustrates a vacuum tube connector 508 and a vacuum tube 516 connecting vacuum generator 510 to exhaust port 414.

Referring to FIGS. 4 and 5, elements of the spincup 400 are preferably made of a material that does not react with developer, for example, PVC or stainless steel, unless stated otherwise. To support wafer 502 in spincup 400, spincup 400 includes an opening in base 416 through which chuck 426 extends. Chuck 426 supports wafer 502 and secures wafer 502 by a vacuum of approximately 540 mmHg. To enclose an ambient region 520, spincup wall 422 is provided. The spincup wall 422 circumscribes the spincup base 416 and extends away from the spincup base 416. The spincup wall 422 includes a cover (not shown) and a sidewall (note: portions of the spincup wall 422 further extending away from the spincup base 416 are not shown). Although the spincup wall 422 is described as having a sidewall and a cover, other configurations are possible, for example, the spincup wall 422 could be a continuous structure with openings for process equipment such as developer dispensing nozzle 504. In FIG. 5, the ambient region 520 does not include wafer backside region 506, and the ambient region 520 is defined by the interior (wafer 502 side) surface of the spincup wall 422, a peripheral portion of the spincup base 416, the exhaust manifold shroud 410, the particle guard 418, the frontside of wafer 502, and a peripheral backside portion of wafer 502.

The exhaust manifold shroud 410 has a bottom surface of sidewall 518 contacting the spincup base 416 of spincup 400 and an exhaust manifold shroud extension 420 contacting particle guard 418. Exhaust manifold shroud 410 circumscribes a lower portion of particle guard 418 to separate the ambient region 520 from the shrouded region 512.

Exhaust manifold shroud 410 is preferably constructed of a material that does not react with developer, for example polyvinyl chloride ("PVC"), and is attached to the spincup base 416 and particle guard 418 with PVC glue. The PVC glue preferably seals the exhaust manifold shroud 410 to the spincup base 416 and particle guard 418 to facilitate efficient exhausting of wafer backside region 506. The exhaust manifold shroud 410 defines exhaust manifold shrouded region 512 and prevents particles in the ambient region 520 from directly entering shrouded region 512. Although exhaust manifold shroud 410 may be constructed of PVC and attached with PVC glue, exhaust manifold shroud 410 may be constructed of other suitable materials as well such as TEFLON(polytetrafluoroethylene), stainless steel, or other materials that do not react with developer and attached by suitable means appropriate for construction material of spincup 400 and exhaust manifold shroud 410. Additionally, the exhaust manifold shroud 410 may be manufactured as an integral part of spincup 400.

Although exhaust manifold shroud 410 is shown having a sidewall 518 and an extension 420, exhaust manifold shroud 410 may have various geometrical configurations suitable to facilitate exhausting wafer backside region 506. For example, exhaust manifold shroud 410 may be a conical section with beveled edges to contact spincup base 416 and particle guard 418. Additionally, if a particle guard, such as particle guard 418, is not present within spincup 400, exhaust manifold shroud 410 may have a first surface which contacts spincup base 416 and a body which extends to within approximately 1 mm of the wafer 502 backside to create a substantially enclosed wafer backside region which can be exhausted similar to the exhausting of wafer backside region 506.

Exhaust port 414 is manufactured by drilling through spincup base 416 and forming threads in the walls of exhaust port 414. The threads allow vacuum tube connector 508 to be screwed into exhaust port 414 forming a tight seal between exhaust port 414 and vacuum tube connector 508. One end of vacuum tube 516 is attached to exhaust shaft connector 508, and the other end of vacuum tube 516 is attached to the vacuum generator 510. Vacuum generator 510 is any suitable device, such as a pump or other device well known to those of ordinary skill in the art, which is used to exhaust wafer backside region 506. Vacuum generator 510 may also be attached to exhaust/drain shaft 424 and used to exhaust the ambient region 520 of spincup 400 also. Vacuum tube connector 508 is made of stainless steel or TEFLON. Vacuum tube 516 is preferably made of teflon. The vacuum tube connector 508 and vacuum tube 516 may be made of developer compatible materials, for example TEFLON or stainless steel, that are corrosion resistant and do not introduce contaminants into the spincup 400.

Figure 1:
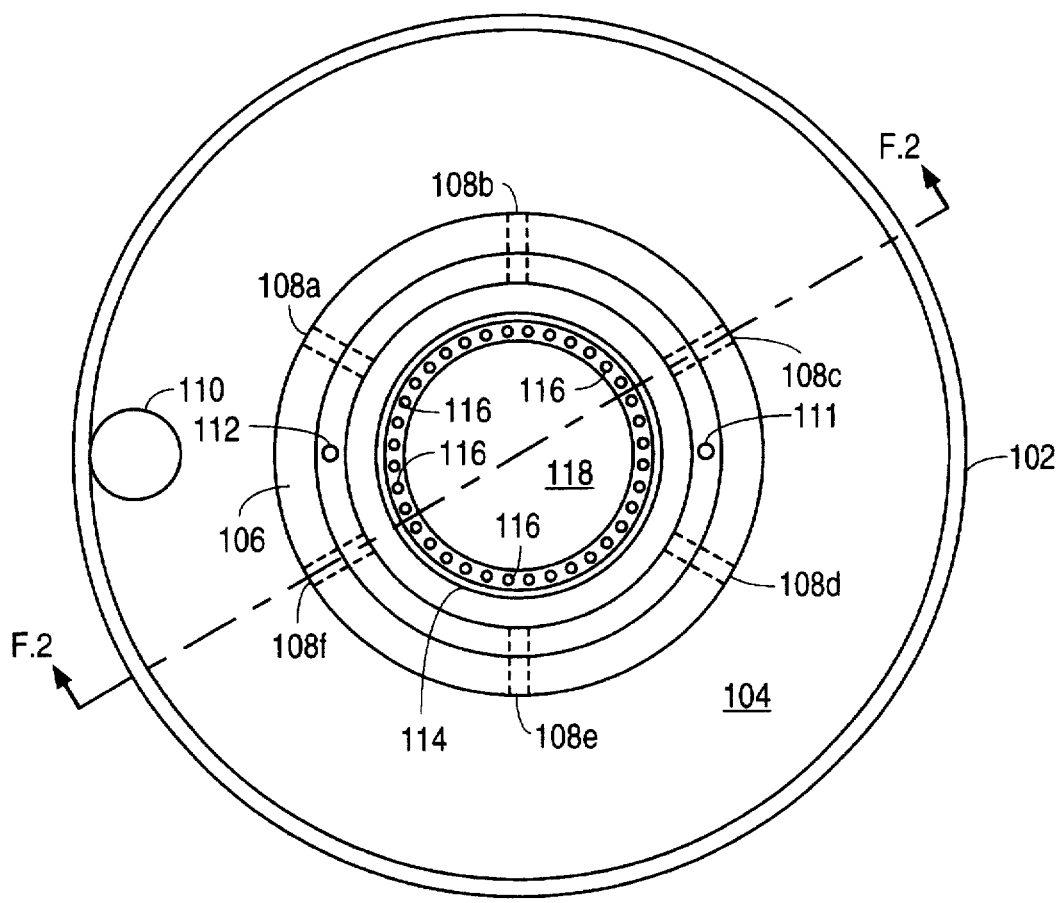
FIG. 1, labeled prior art, illustrates a top plan view of a spincup assembly.
Figure 2:
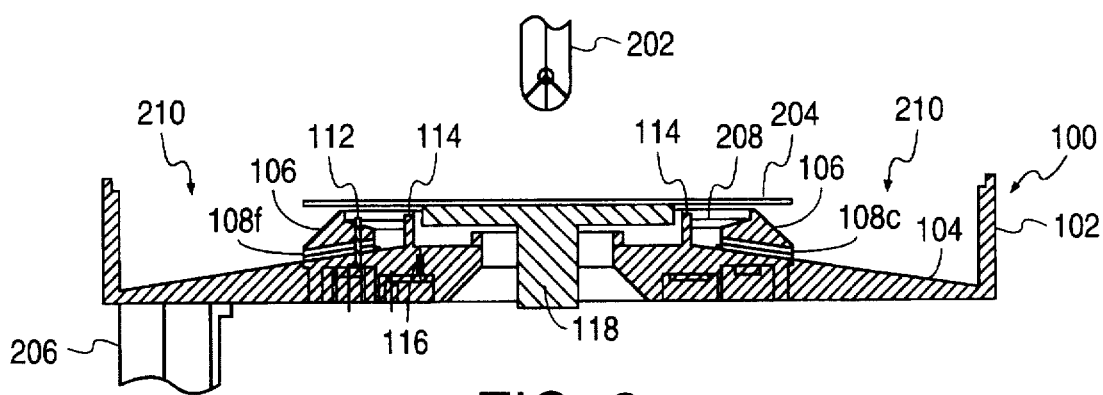
FIG. 2, labeled prior art, illustrates a cross-sectional view of the spincup assembly of FIG. 1.

Referring to FIGS. 3, 4, and 5, during the developer application portion of integrated circuit fabrication in spincups 300a and 300b of developer machine 302, formation of a particle mist occurs. The particle mist is derived primarily from the dispensing of developer from developer dispensing nozzle 504, as discussed above in conjunction with FIGS. 1 and 2. The particle mist enters wafer backside region 506 from ambient region 520 through a gap between particle guard 418 and the backside of wafer 502. Rinse solution dispensed from nozzles 411 and 412 and other particles in a fluid and/or gaseous state present in the ambient region 520 of spincup 400 also enter wafer backside region 506. Additionally, during processing, gas, such as nitrogen gas, exiting through back blow nozzles 402 enters wafer backside region 506 through a gap between blocking wall 404 and the backside of wafer 502. The gas exiting back blow nozzles 402 normally exits back blow nozzles 402 at a rate of approximately 0.5 kg/cm$^2$. The gas exiting back blow nozzles 402 is a source of potential turbulence in wafer backside region 506 as faculty below.

During processing in spincup 400, vacuum generator 510, when connected to vacuum tube connector 508 via vacuum tube 516, creates a negative pressure differential between the vacuum generator 510, exhaust port 414, shrouded region 512, drain holes 406a–406f, and wafer backside region 506. Exhaust port 414, shrouded region 512, and drain holes 406a–406f have a volume that relative to the capabilities of the vacuum generator 510 facilitates the development of the negative pressure differential between the vacuum generator 510 and wafer backside region 506. The vacuum generator 510 creates a pressure of 15–25 mm H$_2$O, preferably about 20 mm H$_2$O, at exhaust port 414.

It is advantageous to develop the negative pressure differential between exhaust port 414 and wafer backside region 506 to exhaust the wafer backside region 506 independently of any other exhaustion in spincup 400. The differential pressure developed between the ambient region 520 and exhaust/drain shaft 424 progressively exhausts ambient region 520 but negligibly, if at all, exhausts wafer backside region 506. It is not practical to reduce wafer backside deposition by exhausting wafer backside region 506 from exhaust/drain shaft 424. If a large enough differential pressure could be developed between exhaust/drain shaft 424 and wafer backside region 506 to reduce wafer backside deposition by effectively exhausting wafer backside region 506 and reducing turbulence in wafer backside region 506, the accompanying exhaustion of the ambient region 520 would adversely affect developer deposition on the frontside or wafer 502. For example, the increased acceleration of particles from the large differential pressure between exhaust/drain 424 and ambient region 520 would disrupt and impair uniform application of developer from developer dispensing nozzle 504 onto the frontside of wafer 502.

Independently exhausting wafer backside region 506 reduces turbulence within the wafer backside region 506 without disturbing particle flow in ambient region 520 and without disrupting or impairing the uniform application of developer on the frontside of wafer 502. Exhausting wafer backside region 506 reduces turbulence in wafer backside region 506 by primarily directing gas flow in the wafer backside region 506 toward the openings of drain holes 406a–406f in the wafer backside region 506. By reducing the turbulence and redirecting the gas flow within backside region 506, a reduction in the number of particles present within wafer backside region 506 having a velocity in the direction of the backside of wafer 502 is reduced leading to a reduction in the amount of material deposition on the backside of wafer 502. Exhausting wafer backside region 506 causes particles and gases within wafer backside region 506 to be exhausted through drain holes 406a–406f, into shrouded region 512, through exhaust port 414, and through vacuum tube 516 to vacuum generator 510. Exhausting wafer backside region 506 reduces accumulation of particles present in the wafer backside region 506 which reduces the amount of material deposition on the backside of wafer 502.

To alternatively independently exhaust wafer backside region 506, multiple exhaust ports may be connected to vacuum generator 510 or to a combination of vacuum generators (not shown). The additional exhaust port(s) open into the shrouded region 512 similar to exhaust port 414 and facilitate exhausting wafer backside region 506 in conjunction with manifold shroud 410. Alternatively, one of more of the additional exhaust port(s) may directly open into wafer backside region 506. Additionally, a channel, such as an exhaust port, could be fabricated to directly enter wafer backside region 506 and obviate the need for an exhaust manifold shroud. However, an exhaust manifold shroud 410 is particularly useful when lack of suitable, unutilized space precludes fabricating an exhaust port which opens directly into wafer backside region 506.

Additionally, the exhaust manifold shroud 410 may have variable dimensions for creating a uniform pressure differential between exhaust port 414 and the respective drain holes 406a–406f. For example, the radius of exhaust manifold shroud 410 could be progressively decreased with the smallest radius located opposite from exhaust port 414 which in the embodiment of FIG. 4 lies between drain holes 406c and 406d. Exhaustion of wafer backside region 506 may be augmented by other exhausting sources and accompanying exhaustion facilitating structures.

To improve fluid drainage through exhaust port 414, the exhaust manifold shroud 410 radius could be increased adjacent to exhaust port 414 in order to locate exhaust port 414 at a lower elevation than the surrounding region of spincup base 416 beneath the exhaust manifold shroud 410.

An advantage of independently exhausting wafer backside region 506 is that in the absence of independent exhaustion, as would occur in the absence of exhaust manifold shroud 410 and in the absence of exhaust port 414 in FIGS. 4 and 5, gas from back blow nozzles 402 would enter wafer backside region 506 and produce a turbulent gas flow within wafer backside region 506. The gas flow would entrain the particle mist entering wafer backside region 506 as well as other particles with insufficient mass to overcome the entrainment and fall to the bottom of wafer backside region 506. Without exhaust manifold shroud 410 and exhaust port 414, the drain holes 406a–406f drain primarily fluid that reaches the bottom of wafer backside region 506 into the ambient of spincup 400; however, drain holes 406a–406f are negligibly effective, if effective at all, in removing the gas and gas entrained particles in wafer backside region 506. A significant quantity of the particles entrained in the gas flow within wafer backside region 506 would deposit on the backside of wafer 502 in the absence of exhaust manifold shroud 410 and exhaust port 414. The number of particles which would deposit on the backside of wafer 502 is directly proportional to the pressure of the gas exiting back blow nozzles 402. As a result increasing the back blow pressure from back blow nozzles 402 to prevent particles from reaching the chuck 426 and wafer 502 interface would increase the wafer 502 backside deposition.

Figure 6:
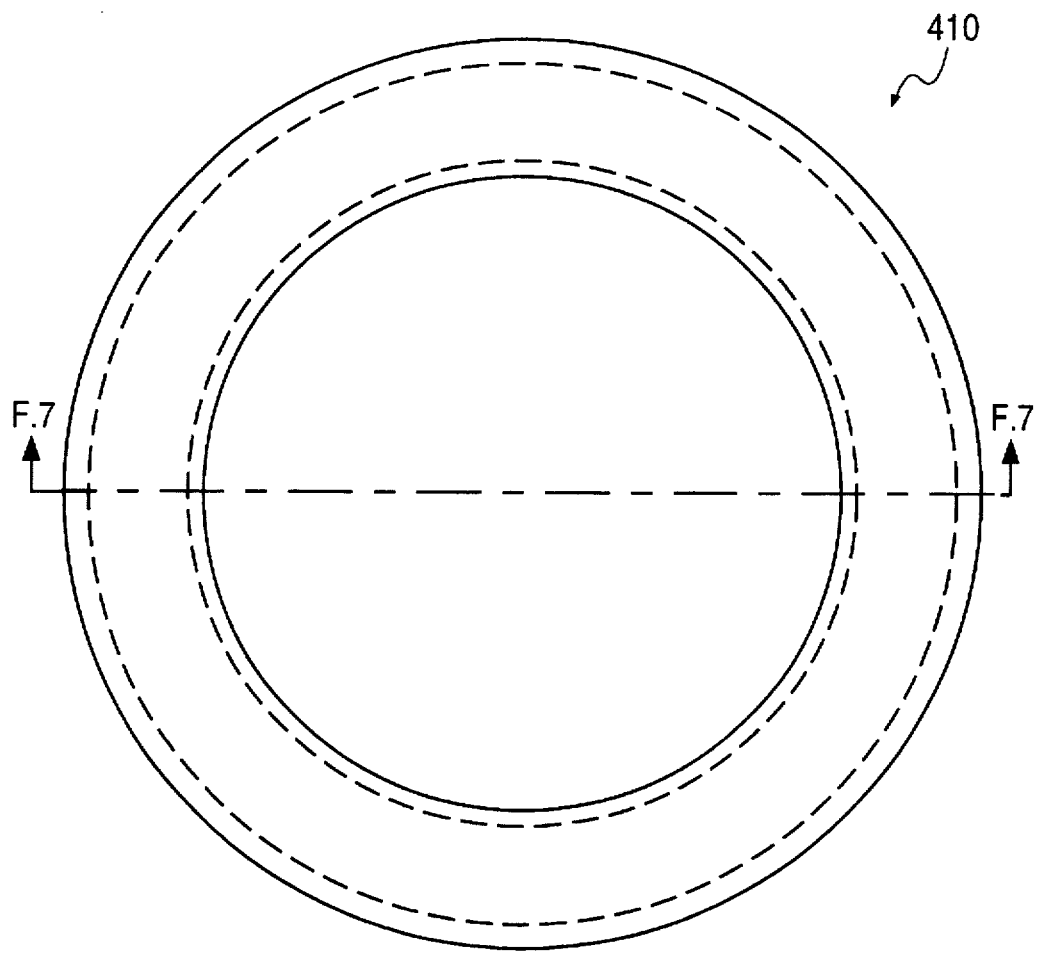
FIG. 6 illustrates a top plan view of the exhaust manifold shroud of FIG. 4.
Figure 7:
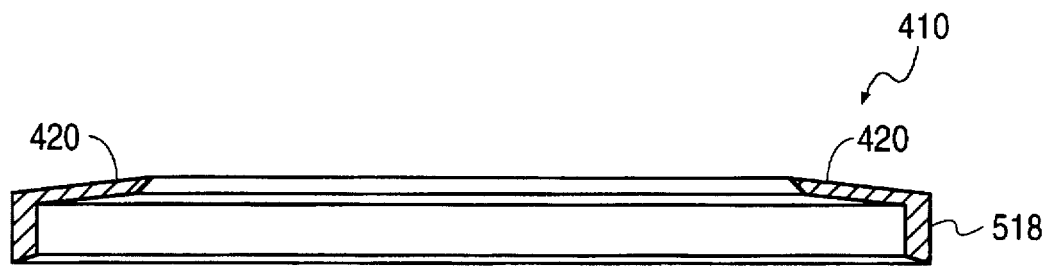
FIG. 7 illustrates a cross-sectional view of the exhaust manifold shroud of FIG. 6.

Referring to FIGS. 6 and 7, exhaust manifold shroud 410 is shown in isolation. When used in conjunction with the Yuasa Mega Line Developer, the outside diameter of the exhaust manifold shroud 410 is 182.0 mm, and the inside diameter is 146.0 mm. The total height of the exhaust manifold shroud 410 is 9.0 mm while the height of sidewall 518 is 7.0 mm. The base of sidewall 518 is beveled at a 7 degree angle to match the slope of spincup base 416 (FIG. 5). The inside edge of extension 420 is beveled at a 45 degree angle to match the slope of the exterior surface of particle guard 418 (FIG. 5). Extension 420 slopes at a 6.3 degree angle do prevent liquid from accumulating on the ambient side or outer side of extension 420. A lathe may be used to form PVC into exhaust manifold shroud 410. Although approximate dimensions of exhaust manifold shroud 410 have been given, other dimensions may be used as well to facilitate exhausting a region beneath a wafer. Additionally, the dimensions of exhaust manifold shroud 410 may be scaled to accommodate other spincup 400 feature dimensions.

Figure 8:
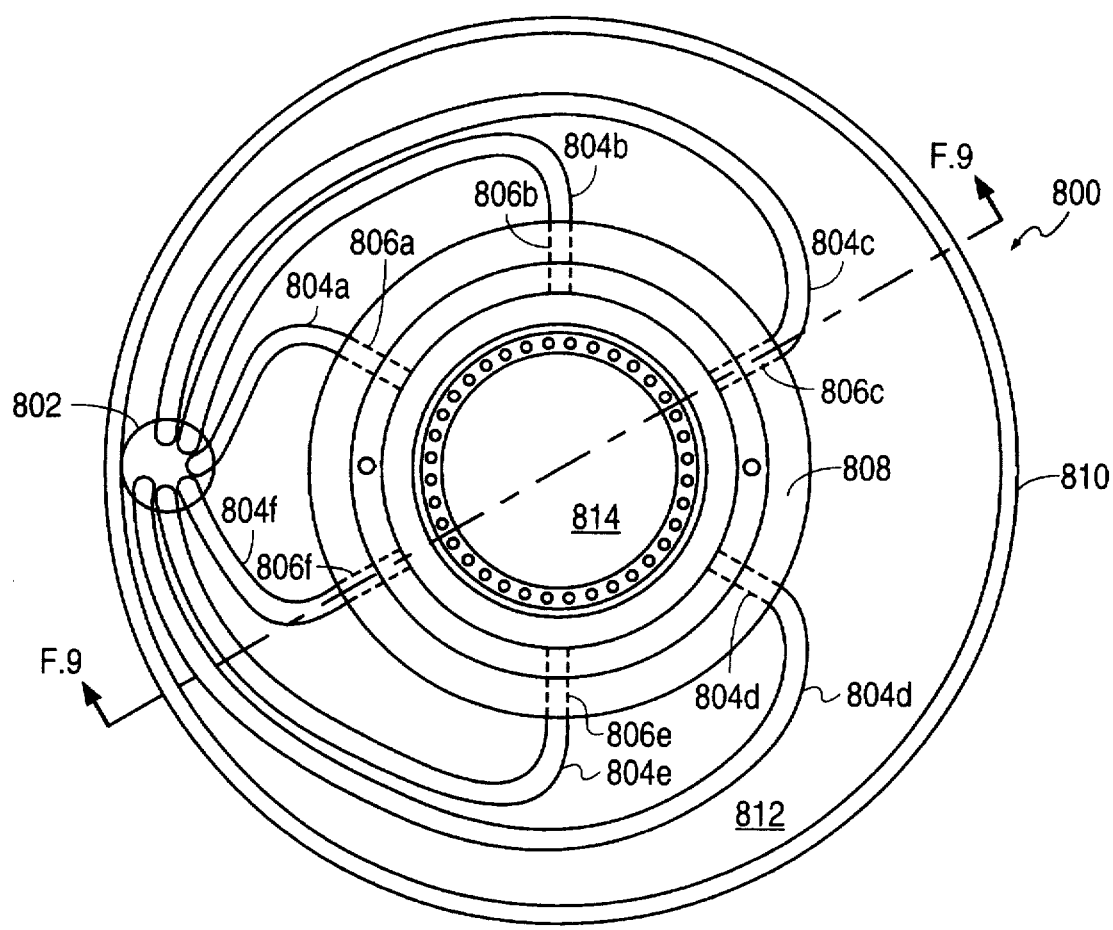
FIG. 8 illustrates a top plan view of a spincup assembly with exhaust tubes.
Figure 9:
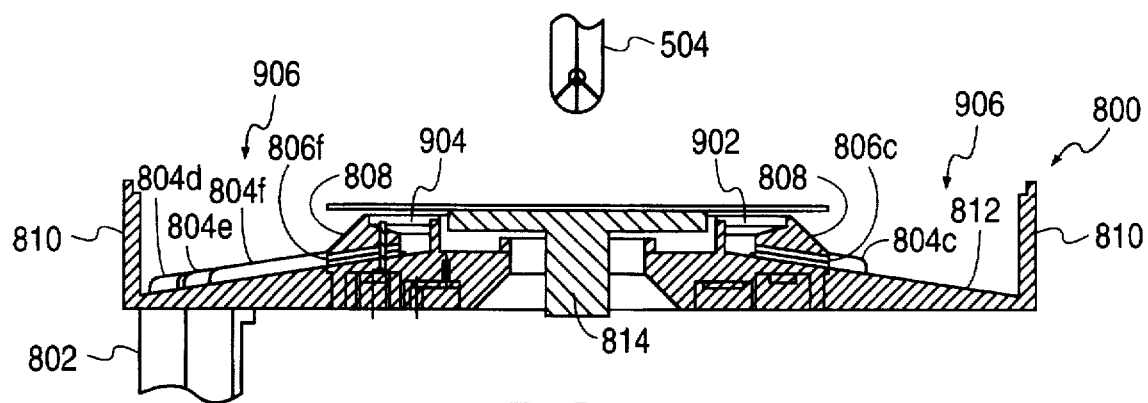
FIG. 9 illustrates a cross-sectional view of the spincup assembly with exhaust tubes of FIG. 8.

Referring to FIGS. 8 and 9, another embodiment of the spincups 300a and 300b is spincup 800. FIG. 8 illustrates a top plan view of a spincup assembly having spincup 800 with exhaust tubes 804a–804f and chuck 814, and FIG. 9 is a cross-sectional view of the spincup assembly of FIG. 8 with exhaust tubes 804c–804f shown. Spincup 800 is another embodiment of a spincup with a wafer backside deposition reduction apparatus which reduces the amount of particle deposition on the backside of a wafer during processing by facilitating the exhaustion of the wafer backside region 904.

Spincup 800 as shown in FIGS. 8 and 9 includes exhaust tubes 804a–804f but does not include an exhaust port similar to exhaust port 414 and the exhaust manifold shroud 410 of FIGS. 4 and 5. Spincup 800 is otherwise identical to spincup 400. Exhaust tubes 804a–804f and drain holes 806a–806f form another embodiment of an exhaust channel. In FIG. 9, the ambient region 906 does not include wafer backside region 904 and is defined by the interior (wafer 902 side) surface of the spincup wall 810, a peripheral portion of the spincup base 812, the particle guard 808, the frontside of wafer 902, a peripheral backside portion of wafer 502, and the exterior surfaces of exhaust tubes 804a–804f.

Exhaust tubes 804a–804f are attached to the outside openings of drain holes 806a–806f, respectively. Exhaust tubes 804a–804f may be made of teflon or other materials capable of conveying gas and/or fluid with preferably no leakage. The exhaust tube material preferably does not introduce contaminants into the ambient of spincup 800 or react with materials in the spincup 800. One end of each of the exhaust tubes 804a–804f is preferably slip fitted into drain holes 806a–806f, respectively. Other means may be used to attach exhaust tubes 804a–804f to drain holes 806a–806f such as welding, gluing, or other means compatible with the exhaust tube materials and the material composition of the drain holes 806a–806f. Additionally, exhaust tubes 804a–804f may be attached to the particle guard 808 surrounding drain holes 806a–806f. A seal is formed between exhaust tubes 804a–804 and drain holes 806a–806f, respectively, to facilitate efficient exhausting of wafer backside region 904 and to prevent particles in the ambient region 906 from entering exhaust tubes 804a–804f, respectively.

The other end of each of the exhaust tubes 804a–804f is inserted about 2 inches into exhaust/drain opening 802. Alternatively, exhaust tubes 804a–804f may be directly connected to the same vacuum generator as exhaust/drain opening 802 or connected to a separate vacuum generator (not shown). Two or more of exhaust tubes 804a–804f may be connected together before being connected to one or more vacuum generators. The vacuum generators may be similar to vacuum generator 510.

During processing, a vacuum generator creates a negative pressure differential between the respective ends of exhaust tubes 804a–804f which exhausts wafer backside region 904. Exhausting wafer backside region 904 reduces turbulence within the wafer backside region 904 and causes gas flow in the wafer backside region 904 to be primarily directed toward the openings of drain holes 806a–806f in the wafer backside region 904. Exhausting wafer backside region 904 obtains wafer backside particle deposition reduction results similar to those obtained in conjunction with spincup 400 discussed above.

During processing, the dispensing of developer and rinse solution and the rotation of wafer 502 (FIG. 5) and 902 (FIGS. 9, 11, and 13) and the exhaustion of ambient region 520 (FIG. 5) and 906 (FIGS. 9, 11, and 13) produce particle flows in the respective ambient regions. For processing conditions different than those discussed herein, the design of exhaust manifold shroud 410 (FIGS. 4 and 5) may be optimized to reduce disturbance of particle flows in the ambient region 520. The design of the exhaust tubes 804a–804f may be optimized to reduce disturbance of particle flows in the ambient region 520 by, for example, covering the exhaust tubes 804a–804f with a plate or shroud or reducing the thickness profile (i.e. the vertical profile in FIG. 9) of exhaust tubes 804a–804f.

Figure 10:
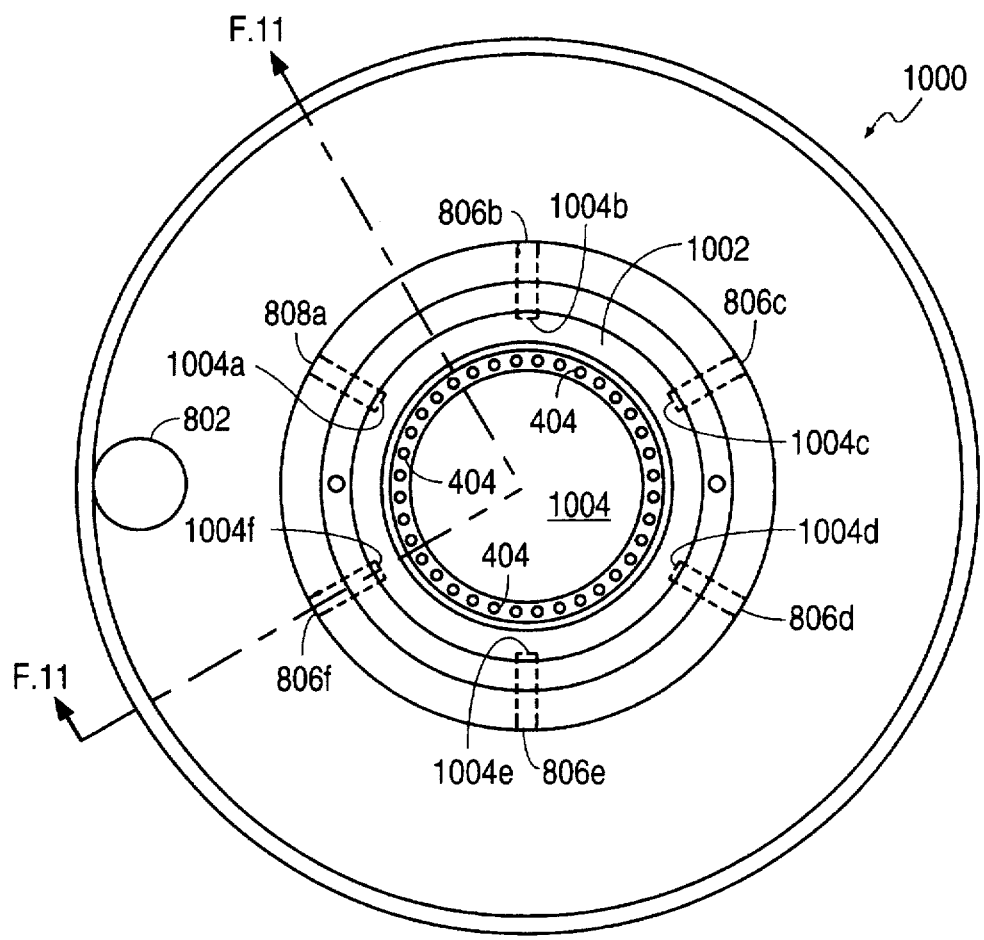
FIG. 10 illustrates a spincup assembly with a particle barrier.
Figure 11:
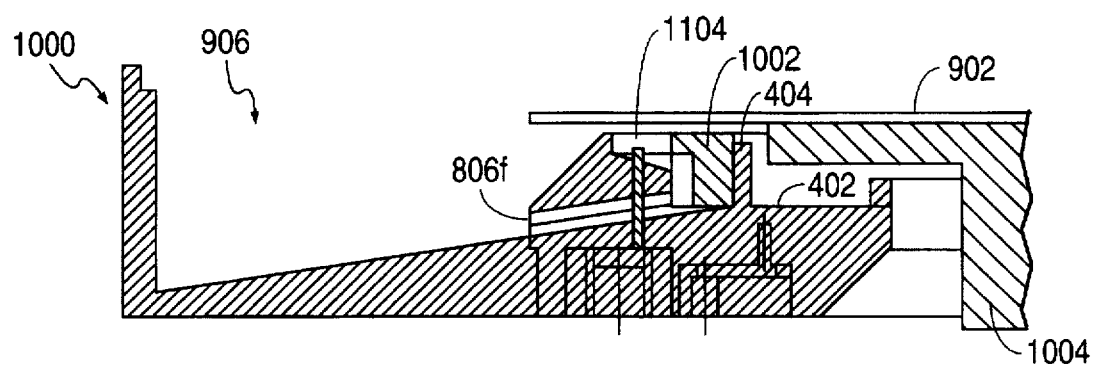
FIG. 11 illustrates a partial cross-sectional view of the spincup assembly with the particle barrier of FIG. 10.

Referring to FIGS. 10 and 11, another method of reducing the amount of particle deposition on the backside of a wafer during processing involves reducing turbulent flow and reducing particle access to a wafer backside region by reducing or eliminating unoccupied space in wafer backside region 1104. Referring to FIGS. 10 and 11, reducing or eliminating unoccupied space in wafer backside region 1104 reduces turbulent flow within wafer backside region 1104 and reduces the number of particles present in wafer backside region 1104 which reduces the amount of material deposition on the backside of the wafer 902.

FIG. 10 illustrates a spincup assembly having spincup 1000 with one embodiment of a particle barrier, particle barrier 1002 and chuck 1004. FIG. 11 is a partial cross-sectional view of the spincup assembly of FIG. 10. Spincup 1000 lacks the exhaust tubes 804a–804f of spincup 800 and includes particle barrier 1002. Spincup 1000 is otherwise identical to spincup 800. Particle barrier 1002 fits within wafer backside region 1104 and reduces the volume of unoccupied space within wafer backside region 1104. Some gas from back blow nozzles 402 and particles from other sources, such as the particle mist discussed above, continue to reach the unoccupied volume of wafer backside region 1104; however, the employment of particle barrier 1002 reduces the quantity of the gas and particles in wafer backside region 1104 and reduces the gas flow turbulence within wafer backside region 1104. Reducing the turbulence within wafer backside region 1104 reduces the number of particles entrained within wafer backside region 1104 and reduces the number of particles having a velocity in the direction of the backside of wafer 902 as discussed above in conjunction with FIGS. 4, 5, 8, and 9.

Since some fluid may still enter wafer backside region 1104, particle barrier 1102 preferably incorporates notches 1104a–1104f to facilitate fluid draining within wafer backside region 904 through drain holes 806a–806f and into exhaust/drain opening 802. Notches 1004a–1004f extend 10 mm from the bottom surface of particle barrier 1104 and have a width of 5 mm.

The inside surface of particle barrier 1002 preferably conforms to the contour of blocking wall 404 and contacts blocking wall 404. As shown in FIG. 10, particle barrier 1002 has the general shape of a ring. The thickness from top to bottom is substantially equal to the height of blocking wall 404. When used with the Yuasa Mega Line Developer (FIG. 3), the thickness of particle barrier 1002 is 12 mm. The top surface of particle barrier is substantially planar.

Figure 12:
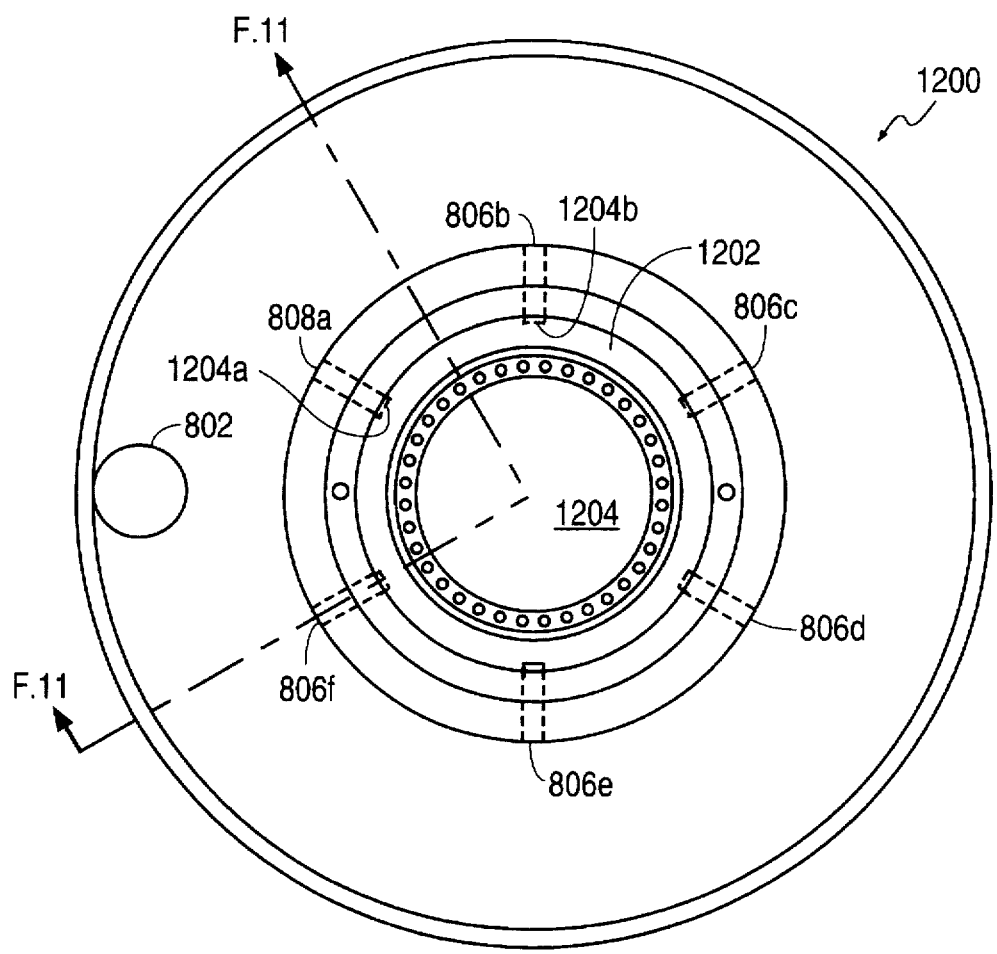
FIG. 12 illustrates a spincup assembly with an alternative particle barrier.
Figure 13:
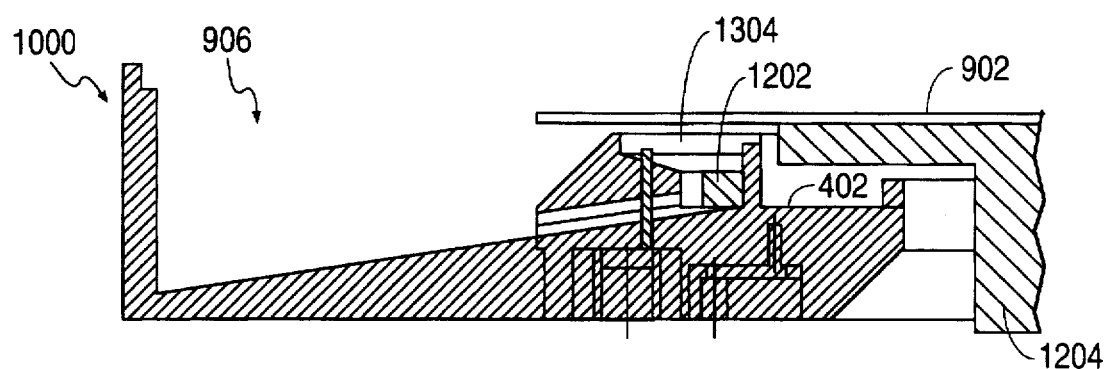
FIG. 13 illustrates a partial cross-sectional view of the spincup assembly with the particle barrier of FIG. 12.

Referring to FIGS. 12 and 13, another embodiment of a particle barrier, particle barrier 1202 is illustrated. FIG. 12 illustrates a spincup assembly having spincup 1200 with particle barrier 1202 and chuck 1204. FIG. 13 is a partial cross-sectional view of the spincup assembly of FIG. 12. Spincup 1200 lacks the exhaust tubes 804a–804f of spincup 800 and includes particle barrier 1202. Spincup 1200 is otherwise identical to spincup 800. Particle barrier 1202 is similar to particle barrier 1002 except that the thickness from top to bottom of particle barrier 1202 is approximately one half the thickness of particle barrier 1002. Additionally, notches 1204a–204f extend from a bottom surface of particle barrier 1202 to a top surface of particle barrier 1202. The notches 1204a–1204f facilitate the draining of fluid within wafer backside region 1304 through drain holes 806a–806f and into exhaust/drain opening 802.

Particle barrier 1202 fits within wafer backside region 1304 and reduces the volume of unoccupied space within wafer backside region 1304. Some gas from back blow nozzles 402 and particles from other sources such as the particle mist discussed above continue to reach the unoccupied volume of wafer backside region 1304; however, the employment of particle barrier 1202 reduces the quantity of the gas and particles in wafer backside region 1304 and reduces the gas flow turbulence within wafer backside region 1304. Additionally, reducing the turbulence within wafer backside region 1304 reduces the number of particles entrained within wafer backside region 1304. Spincup 1200 with particle barrier 1202 provides advantages similar to those achieved in conjunction with particle guard 1002 in FIG. 11.

The particle barriers 1002 and 1202 are preferably made of PVC and may be formed on a lathe. The notches 1004a–1004f and 1204a–1204f are formed using a milling machine. Both particle barriers 1002 and 1202 are preferably slip fitted into wafer backside region 904 and wafer backside region 1304, respectively. However, they may be attached with PVC glue. Additionally, depending on the composition of the particle barrier, other means of attaching the particle barriers to a spincup may be used such as welding. Furthermore, both particle barrier 1002 and 1202 may be manufactured as an integral part of spincups 1000 and 1200, respectively. Although the particle barrier is preferably one piece, it may be formed from multiple pieces. Additionally, although the particle barrier is preferably formed as a solid, other formations may be used to reduce the unoccupied space beneath a wafer. For example, the particle barrier may be hollow or have an outer surface and a top surface similar to exhaust manifold shroud 410 (FIGS. 6 and 7) to create an enclosure underneath a wafer which denies access to particles to the space occupied and enclosed by the particle barrier. Also, particle barriers may have various widths and be formed without notches.

While the invention has been described with respect to the embodiments and variations set forth above, these embodiments and variations are illustrative and our invention is not to be considered limited in scope to these embodiments and variations. For example, the various shapes and dimensions set forth herein are illustrative, and other shapes, dimensions, flow rates, and pressures may also be effective for the intended purpose. Also, features set forth herein may be scaled to accommodate varying wafer and spincup sizes. Furthermore, particle barriers described above may be used in conjunction with a wafer backside particle reduction apparatus which facilitates the exhausting of a region beneath a wafer such as the exhaust manifold shroud 410 (FIGS. 4 and 5) and exhaust tubes (FIGS. 8 and 9). Accordingly, other embodiments and variations not described herein are to be considered within the scope of our invention as defined by the following claims.

What is claimed is:

1. A spincup for use with a chuck for supporting a wafer, comprising:

a base having an opening for accommodating the chuck;

a wall circumscribing the base and enclosing an ambient region;

a particle guard, the particle guard contacting the base of the spincup and circumscribing the opening, wherein when the wafer and chuck are present, the particle guard, a backside of the wafer, and the chuck define a wafer backside region, and wherein the particle guard includes an exterior surface;

a first exhaust channel isolated from the ambient region and coupled to the wafer backside region to exhaust the wafer backside region; and a shroud having a first surface for contacting the base of the spincup and a second surface for contacting the exterior surface of the particle guard; wherein the shroud, the particle guard and the spincup base define a shrouded region, and the first exhaust channel includes the shrouded region.

2. The spincup in claim 1, wherein the particle guard further includes an orifice extending from the exterior surface into the wafer backside region, and wherein the first exhaust channel further includes the orifice and an exhaust port for connecting a vacuum generator to the exhaust channel.

3. A spincup as in claim 2, wherein the shroud is polyvinyl chloride.

4. A spincup as in claim 2, wherein the shroud is an integral part of the spincup.

5. A spincup as in claim 2, wherein the shroud includes a sidewall and an extension.

6. A spincup as in claim 1, wherein the particle guard includes an exterior surface and an orifice extending from the exterior surface into the wafer backside region, the spincup further comprising:

an exhaust port for connecting a vacuum generator to the first exhaust channel; and an exhaust tube having a first end coupled to the exhaust port and a second end coupled to the orifice;

wherein the first exhaust channel includes the exhaust tube, the exhaust port, and the orifice.

7. A spincup as in claim 6 wherein the exhaust tube is made of poly-etrafluoroethylene.

8. The spincup in claim 1 further comprising a second exhaust channel disposed through the spincup and coupled to the ambient region.

9. The spincup in claim 1 wherein the first exhaust channel includes an exhaust port extending from a backside of the base into the wafer backside region, and the exhaust port is coupled to a vacuum generator.

10. The spincup in claim 1 further comprising a plurality of exhaust channels coupled to the wafer backside region wherein each of the exhaust channels independently exhaust the wafer backside region.

11. A spincup assembly comprising:

a spincup including a base and a wall circumscribing the base and enclosing an ambient region;

a rotatable chuck for supporting a wafer in the spincup;

a particle guard, the particle guard contacting the base of the spincup and circumscribing the chuck, wherein the particle guard, the base of the spincup between the particle guard and the chuck, and the chuck define a wafer backside region, and a top portion of the particle guard and an adjacent portion of the chuck define a particle inlet to the wafer backside region;

an exhaust channel coupled to the wafer backside region to exhaust the wafer backside region; and an exhaust manifold shroud having a first surface attached to the base of the spincup and a second surface attached to the particle guard; wherein the exhaust manifold shroud, the particle guard and the base of the spincup define a shrouded region and the exhaust manifold shroud separates the ambient region from the shrouded region to prevent particles in the ambient region from directly entering the shrouded region, and the exhaust channel includes the shrouded region.

12. A spincup assembly as in claim 11, wherein the particle guard includes a first surface, a second surface, and a drain hole extending into the wafer backside region, the spincup assembly further comprising:

an exhaust port for connecting a vacuum generator to the exhaust channel for creating a negative pressure differential between the exhaust port and the wafer backside region;

13. A spincup assembly as in claim 12, wherein the exhaust manifold shroud is polyvinyl chloride.

14. A spincup assembly as in claim 11, wherein the particle guard includes a first surface, a second surface, and a drain hole extending into the wafer backside region, the spincup assembly further comprising:

an exhaust port for connecting a vacuum generator to the exhaust channel; and an exhaust tube having a first end coupled to the exhaust port and a second end coupled to the drain hole;

wherein the exhaust channel includes the exhaust tube, the exhaust port, and the drain hole.

15. A spincup assembly as in claim 14 wherein the exhaust tube is made of polytetrafluoroethylene.

16. A developer machine having a spincup, the spincup including a wafer backside deposition reduction apparatus for reducing particle deposition on the backside of a wafer during developer deposition, the developer machine comprising:

a first heating process station for heating the wafer;

a cooling process station for cooling the wafer;

a spincup processing station for applying developer to the wafer, the spincup processing station having a chuck for supporting a wafer in the spincup, and a spincup having a base, a wall circumscribing the base and enclosing an ambient region, a particle guard, the particle guard contacting the base of the spincup and circumscribing the chuck, wherein the particle guard, the base of the spincup between the particle guard and the chuck, and the chuck define a wafer backside region, an exhaust channel isolated from the ambient region and coupled to the wafer backside region to exhaust the wafer backside region, and an exhaust manifold shroud having a first surface attached to the base of the spincup and a second surface attached to the particle guard; wherein the exhaust manifold shroud, the particle guard and the base of the spincup define a shrouded region, and the exhaust manifold shroud separates the ambient region from the shrouded region to prevent particles in the ambient region from directly entering the shrouded region, and wherein the exhaust channel further includes the shrouded region;

a second heating process station for heating the wafer; and a transport means for transporting the wafer between all of the process and processing stations.

* * * * *